US008963572B2

(12) United States Patent
Lanowitz et al.

(10) Patent No.: US 8,963,572 B2
(45) Date of Patent: Feb. 24, 2015

(54) TESTING IN TRAYS

(75) Inventors: Mark Lanowitz, Kernersville, NC (US);
Jerry Izquiredo, Colfax, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 398 days.

(21) Appl. No.: 13/324,586

(22) Filed: Dec. 13, 2011

(65) Prior Publication Data
US 2012/0146678 A1 Jun. 14, 2012

Related U.S. Application Data

(60) Provisional application No. 61/422,504, filed on Dec. 13, 2010, provisional application No. 61/442,529, filed on Feb. 14, 2011.

(51) Int. Cl.
*G01R 31/00* (2006.01)
*G01R 31/28* (2006.01)
*H01L 21/673* (2006.01)

(52) U.S. Cl.
CPC ...... *G01R 31/2893* (2013.01); *H01L 21/67333* (2013.01)
USPC .................................................. 324/756.02

(58) Field of Classification Search
None
See application file for complete search history.

(56) References Cited

U.S. PATENT DOCUMENTS

| 5,227,717 | A  | * | 7/1993  | Tsurishima et al. ...... 324/754.11 |
| 5,635,832 | A  | * | 6/1997  | Ito et al. ................... 324/756.02 |
| 5,800,205 | A  | * | 9/1998  | Arakawa ....................... 439/526 |
| 6,313,652 | B1 | * | 11/2001 | Maeng ..................... 324/750.05 |
| 6,406,246 | B1 | * | 6/2002  | Itoh et al. ....................... 414/274 |
| 6,919,734 | B2 | * | 7/2005  | Saito et al. ............... 324/750.09 |
| 7,129,726 | B2 | * | 10/2006 | Tashiro et al. ........... 324/750.25 |
| 7,777,514 | B2 | * | 8/2010  | Weinraub et al. ........ 324/757.02 |

OTHER PUBLICATIONS

Di Stefano, S. "Test in tray by Centipede Systems," Centipede Systems, Oct. 2008, 24 pages, http://www.centipedesystems.com/wp-content/uploads/2010/02/oct2009_distefano1.pdf.
Unknown Author, "MT2168 video," Multitest a Dover Company, Accessed Apr. 10, 2012, 1 page, http://www.multitest.de/eng/Page002872.asp.

* cited by examiner

*Primary Examiner* — Paresh Patel
(74) *Attorney, Agent, or Firm* — Withrow & Terranova, P.L.L.C.

(57) ABSTRACT

Embodiments of the system and methods disclosed herein reduce the amount of handling necessary to organize the IC packages and thus may be utilized to increase the throughput of a test handler. To organize the IC packages, the IC packages may be initially placed on a first IC tray by the test handler. All of the IC packages are tested from the first IC tray so as to generate operational state data items for the IC packages. After all of the IC packages on the first IC tray are tested, the IC packages are sorted based on the operational state data items. In this manner, the operational state data items of the IC packages are known before sorting and thus not every IC package needs to be picked and placed in order to organize the IC packages.

17 Claims, 15 Drawing Sheets

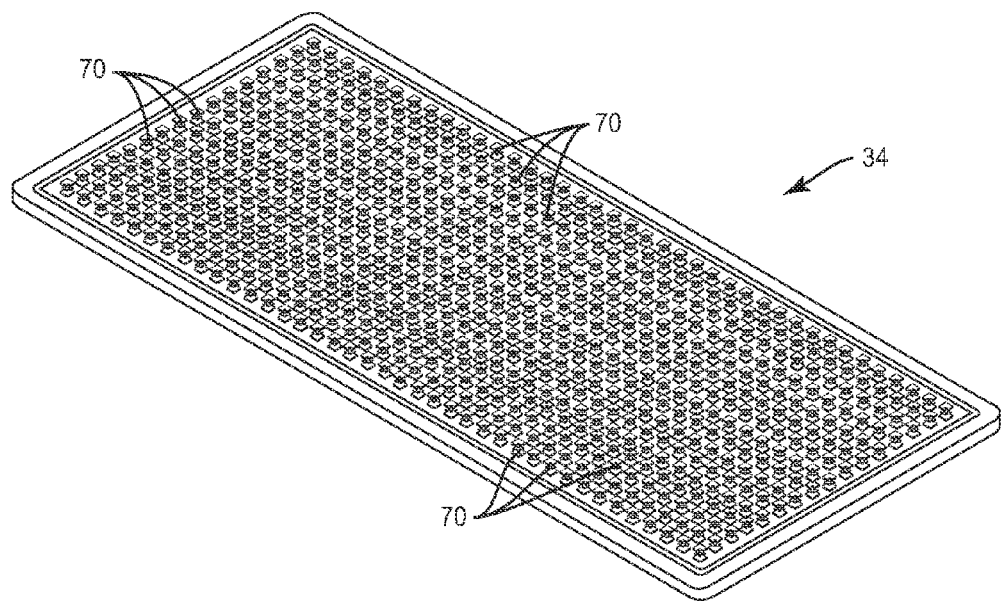
FIG. 4A
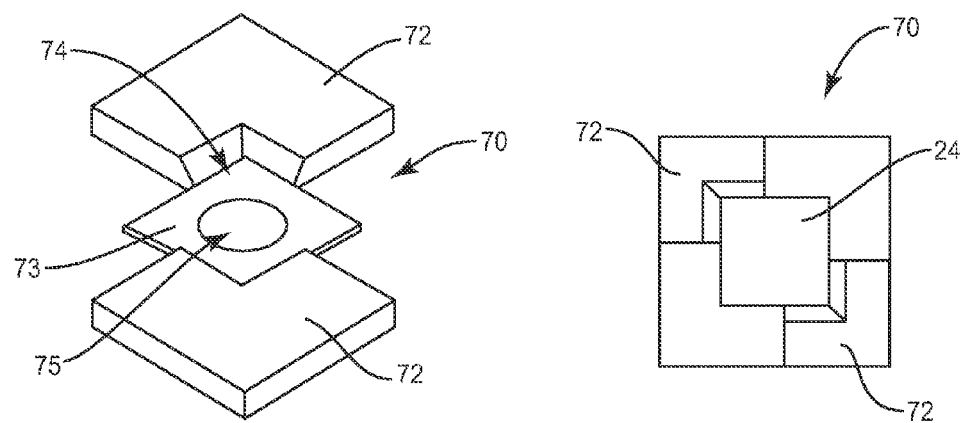
FIG. 4B
FIG. 4C

US 8,963,572 B2

TESTING IN TRAYS

RELATED APPLICATIONS

This application claims the benefit of U.S. Provisional Patent Application Ser. No. 61/422,504 filed Dec. 13, 2010 and U.S. Provisional Patent Application Ser. No. 61/442,529, filed Feb. 14, 2011, the disclosures of which are hereby incorporated herein by reference in their entireties.

FIELD OF THE DISCLOSURE

Embodiments of the present disclosure relate to a test handler for integrated circuit packages and methods of operating the same.

BACKGROUND

Those skilled in the art will appreciate the scope of the present disclosure and realize additional aspects thereof after reading the following detailed description of the preferred embodiments in association with the accompanying drawing figures.

An important process in the manufacturing of semiconductor product is operations testing. Through the performance of operations testing, the semiconductor manufacturer ensures that quality integrated circuit (IC) packages are being sold to their customers. Generally, the process is highly automated and requires sophisticated electronic-mechanical system typically referred to as test handlers. Test handlers may include robotic electromechanical machinery used for transporting an IC package to a test site. Once at the test site, the IC packages are inserted into a test socket on a printed testing board. There, the printed testing board performs an operations test and subsequently a pick and place handling device takes the tested IC packages to a location in a binning area. Unfortunately, this creates a bottleneck in the throughput of the typical test hander. In essence, the bottleneck is created during the organization of the IC packages because each of the IC packages must be handled by the test handler in order to place the IC packages in the appropriate binning area.

What is needed then are methods and systems that reduce the handling of the IC packages in order to increase the throughput of the test handler.

SUMMARY

The disclosure relates to systems and methods of organizing integrated circuit (IC) packages based on the operational state of the IC packages. Embodiments of the system and methods reduce the amount of handling necessary to organize the IC packages and thus may be utilized to increase the throughput of a test handler. In one embodiment, the IC packages are initially placed on a first IC package tray. Next, all of the IC packages are tested from the first IC package tray so as to generate operational state data items for the IC packages. Each of these operational state data items indicates an operational state of one of the IC package on the first IC package tray. Once all of the IC packages on the first IC package tray are tested, the IC packages are sorted based on the operational state data items. In this manner, the operational state data items of the IC packages are known before sorting and thus not every IC package needs to be picked and placed in order to organize the IC packages. Consequently, the test handler throughput is increased.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 4A illustrates one embodiment of a high precision integrated circuit package (HPIC) tray on which the IC packages placed to test the IC packages.

FIG. 4B illustrates a perspective view of an embodiment of a pockets on the HPIC tray shown in FIG. 4A.

FIG. 4C illustrates a top view of the pocket shown in FIG. 4B holding one of the IC packages.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to test handlers and methods of operating test handlers that reduce amount of handling necessary in order to organize integrated circuit (IC) packages. To do this, embodiments of the test handler place the IC packages on an IC package tray. The IC package tray may be a high-precision IC package (HPIC) tray that configured to hold each of the IC packages in a testing orientation so that a printed testing board can engage the IC packages. The IC packages on the IC package tray are tested in order to generate operational state data items. Each of these operational state data items may indicate an operational state of one of the IC packages on the IC package tray. These operational state data items may then populate a tray map, where each of the operational state data items is provided in the tray map in accordance with a tray location of the IC package on the IC package tray. For example, the high-precision IC package tray may define pockets that have been configured to hold each IC package in the test orientation. The tray map may comprise various pocket data elements that correspond to each of the pockets in the HPIC tray. When one or more of the IC packages are tested to generate operational state data items, the pocket data elements corresponding to the pockets are populated with the operational state data items of the IC packages. After all of the IC packages on the first IC package tray have been tested, the test handler sorts the IC packages based the operational state data items. By knowing the operational state of all of the IC packages prior to sorting them, techniques can be developed to reduce the handling of the IC packages and thereby increase the throughput of the test handler.

Figure 1:
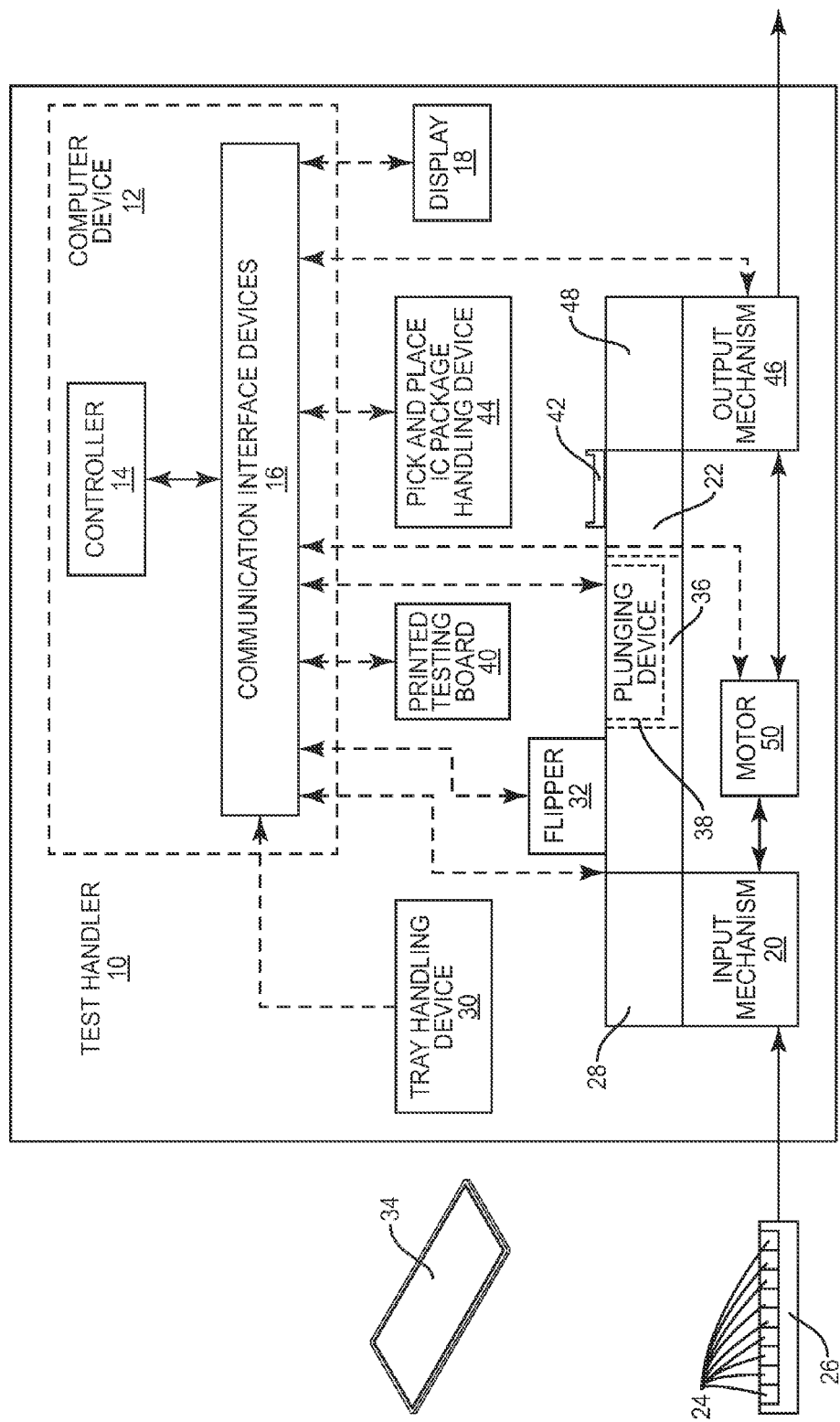
FIG. 1 illustrates a block diagram of one embodiment of a test handler configured to organize integrated circuit (IC) packages.

FIG. 1 illustrates a block diagram of one embodiment of a test handler 10 in accordance with this disclosure. The test handler 10 of FIG. 1 has a computer device 12. The computer devise 12 has a controller 14 and one or more communication interface devices 16. The controller 14 is configured to control the various components of the test handler 10 in order to provide the desired functionality. The controller may be configured through general purpose hardware and software, hardwired control logic, and/or some combination of both. The communication interface devices 16 may be operably associated with the controller 14 thereby allowing the controller 14 to receive and transmit data and/or control signals to the various components of the test handler 10. For example, the communication interface devices 16 may include various types of input/output terminals, digital to analog converters, analog to digital converters, data formatting components, and/or the like, to provide communication between the controller 14 and the various components of the test handler 10. In this embodiment, the test handler 10 includes a display 18. The display 18 is operable to provide visual representations of data from the controller 14 to a system administrator. In one embodiment the display 18 is a touch screen that allows the system administrator to input configuration data for the test handler 10. Other types of input/output devices (not shown), such as a mouse, keyboard, flash memory drives, CD drives, and/or the like may be included with the test handler 10.

The test handler 10 of FIG. 1 includes an input mechanism 20 and a test table 22. The input mechanism 20 may be any type of mechanism configured to deliver IC packages 24 to the test table 22 so that the IC packages 24 undergo testing. The test table 22 may include various movable table segments along with various different areas for organizing the IC packages 24. In this embodiment, the IC packages 24 are provided on an input standard IC package (SIC) tray 26 that is fed into the input mechanism 20. The input mechanism 20 may be an elevator device that includes an input segment 28. To deliver the input SIC tray 26 to the test table 22, the input SIC tray 26 is provided on the input segment 28 and then elevated up to the test table 22. Once the input SIC tray 26 has been elevated, the test handler 10 may include various tray handling devices that can be utilized to carry trays and transport them to the appropriate locations on the test table 22. In this embodiment, the test tray handling devices include a tray handling device 30 and a flipper 32. The tray handling device 30 may be utilized to grab the input SIC tray 26 (along with other IC package trays) with the IC packages 24 from the input segment 28 and load the input SIC tray 26 into the flipper 32. Some embodiments of the test handler 10 may include a plurality of tray handling devices, like the tray handling device 30 and/or a plurality of flippers, like the flipper 32. For example, the test handler 10 may actually include the various flippers 32, in this case an input flipper (referred to as element 32A but not actually specifically illustrated) of an input loading area, and an output flipper (referred to as element 32B but not actually illustrated) at an output loading area. In this manner, a different group of IC packages 24 received on different input SIC trays 26 can be processed at different stages of the test handler 10 simultaneously. Alternatively, rather than utilizing the tray handling device 30 to load the input SIC tray 26 into the flipper 32, the input segment 28 may interlock with the test table 22 so that a track (not shown) can transport the input SIC tray 26 into the flipper 32. In yet another alternative, the input mechanism 20 may include a conveyor belt system that delivers the input SIC tray 26 to the test table 22 and loads the input SIC tray 26 into the flipper 32.

Referring again to FIG. 1, a high-precision IC package (HPIC) tray 34 may also be loaded into the flipper 32 by the tray handling device 30. To transfer the IC packages 24 from the input SIC tray 26 to the HPIC tray 34 the flipper 32 is configured to flip the input SIC tray 26 and the HPIC tray 34 so that the IC packages 24 are placed on the HPIC tray 34. In one embodiment, the flipper 32 may be fixed on the test table 22. Once the IC packages 24 have been transferred, both the empty input SIC tray 26 and the HPIC tray 34 may then be removed from the flipper 32. As explained in further detail below the HPIC tray 34 is configured to hold the IC packages 24 so that the IC packages 24 are in a test orientation. After removal from the flipper 32, the input SIC tray 26 and the HPIC tray 34 may be moved along tracks provided by the test table 20 to an appropriate area or segment. If desired, the tray handling device 30 may be used to transfer IC package trays onto the appropriate track so that the IC package trays reach a desired output segment. In one embodiment of the test table 20, the tracks on the test table 20 form fixed paths. Additionally or alternatively, the tracks on the test table 20 may have various intersecting paths on the test table 20. The controller 14 may be configured to control mechanisms that allow for path selection so that a particular IC package tray reaches a desired destination. In this case, the HPIC tray 34 is then moved to a testing area 36 on the test table 22.

At the testing area 36, the test table 22 shown in FIG. 1 includes a plunging device 38 and the test handler 10 includes a printed testing board 40 provided over the plunging device 38. The plunging device 38 may include one or more plungers and the plunging device 38 may be operable to propel these plunger heads. Antipodal to the plungers, the printed testing board 40 may include one or more test sockets that are configured to engage the IC packages 24. Other alternative embodiments of the test table 22 may include the printed testing board 40 while the test handler 10 provides the plunging device 38 over the printed testing board 40. In still other alternative embodiments, the plunging device 38 and printed testing board 40 may be integrated so that the test sockets are plunged to the IC packages 24 on the HPIC tray 34. In this embodiment, when the HPIC tray 34 is moved to the testing area 36, the HPIC tray 34 with the IC packages 24 may be positioned between the plunging device 38 and the printed testing board 40. Particularly, the controller 14 may be configured to position the HPIC tray 34 so that a set of one or more of the IC packages 24 are aligned with the test sockets on the printed testing board 40 and the plungers on the plunging device 38. The set of one or more of the IC packages 24 may vary in number for different embodiments of the test handler 10 depending on the number of test sockets on the printed testing board 40 and/or the number of plungers on the plunging device 38. Note that the positions of the plungers of the plunging device 38 and/or the positions of the test sockets on the printed testing board 40 may be fixed or may also vary depending on the particular characteristics of the plunging device 38 and the printed testing board 40. The controller 14 may thus be configured to further align the positions of the plungers and/or test sockets if these positions are not fixed on the plunging device 38 and/or printed testing board 40.

Once the HPIC tray 34 has been positioned, the controller 14 may then actuate the plungers on the plunging device 38 whereby the plungers propel either the set of the IC packages 24 or the HPIC tray 34 itself so that the set of the IC packages 24 engage the test sockets on the printed testing board 40. The printed testing board 40 then tests the set of IC packages 24 to generate one or more operational state data items. Each operational state data item indicates an operational state of the IC package 24 in the set of IC packages 24.

In this embodiment, the printed testing board 40 may be operable to perform one or more operations test on each of the IC packages 24 in a test socket. For example, the printed testing board 40 may perform DC parametric test that verify steady-state electrical parameters of the IC package 24. The printed testing board 40 may also perform AC parametric test to verify time-related parameters of the IC package 24 as well as to check that the IC package 24 operates appropriately throughout a frequency range. In addition, the printed testing board 40 may perform functional test to verify that the functions of the IC package 24 are implemented in accordance with its intended design. Finally, structural test may be performed by the printed testing board 40 to prove that the IC package 24 was manufactured free of structural defects. If the IC package 24 passes all of the operations tests, the operational state data item for the IC package 24 may indicate a passing operational state of the IC package 24. On the other hand, if the IC package 24 fails one or more of the operations tests, the operations state data item for the IC package 24 may indicate the particular failure operational state of the IC package 24.

Once this set of IC packages 24 is tested, the controller 14 may align the HPIC tray 34 so that another set of the IC packages 24 are positioned between the test sockets and the plungers. The process described above is then repeated to generate operational state data items for the other set of IC packages 24. The controller 14 may be configured to repeat this process until all of the IC packages 24 on the HPIC tray 34 have been tested and there are operational state data items for all of the IC packages 24. These operational state data items may populate a tray map, where each of the operational state data items are associated with a tray location of the IC package 24 on the HPIC tray 34.

After testing all of the IC packages 24 on the HPIC tray 34, the test handler 10 sorts the IC packages 24 based on the operational state data items. To organize the IC packages 24 after testing, the test handler 10 may load an output SIC tray 42 into the flipper 32. The flipper 32 may then be flipped to place the IC packages 24 on the output SIC tray 42. Tray locations in the output SIC tray 42 may correspond to the tray locations on the HPIC tray 34. Therefore, assuming that the output SIC tray 42 and the HPIC tray 34 are appropriately aligned, the IC packages 24 will be placed on the output SIC tray 42 at tray locations corresponding to the tray locations on the HPIC tray 34. Accordingly, the controller 14 may utilize the tray map to determine how to sort the IC packages 24 once the IC packages 24 have been transferred to the output SIC tray 42.

In one embodiment, the controller 14 uses the tray map to operate an pick and place IC package handling device 44 provided by the test handler 10. The IC package pick and place handling 44 is configured to pick the IC packages 24 from the output SIC tray 42 and place them in the appropriate output area or output segment of the test table 22. The pick and place IC package handling device 44 may include vacuum pick-and-place heads (not shown) each operable to handle individual IC packages 24. An individual sensor may be provided to monitor the operation activity on each vacuum pick-and-place head.

In addition, the test handler 10 shown in FIG. 1 has an output mechanism 46 that includes a pass output segment 48. The output mechanism 46 may include other output segments (not shown in FIG. 1) designated as fail output segments. Using the tray map, the controller 14 may operate the pick and place IC package handling device 44 to remove the IC packages 24 from tray locations of the output SIC tray 42 associated with operational state data items that indicate that the IC packages 24 are operating in a failing operational state. As mentioned above, since the IC packages 24 may fail any combination of one or more operations tests, the operational state data items in the tray map may indicate that there are any number of failing IC packages 24 operating in different failing operational states. Each of these IC packages 24 (failing IC packages) may be removed from the output SIC tray 42 and placed in the appropriate fail output segment by the pick and place IC package handling device 44. The IC packages 24 that remain in the output SIC tray 42 are thus passing IC packages 24 that have passed the operations tests. As explained in further detail below, the output SIC tray 42 may be supplemented from another SIC tray (buffer tray) in a buffer area to replace the removed failing IC packages 24. Once the output SIC tray 42 is full, the output SIC tray 42 may be passed to the pass output segment 48. In this embodiment, the pass output segment 48 may be elevated down from the test table 22 and output from the test handler 10.

The test handler 10 may include a motor 50 to drive the movement of the HPIC tray 34 along the tracks of the test table 22, elevate the input segment 28 of the input mechanism 20, and elevate the output segment 48 of the output mechanism 46. The motor 50 may be any type of motor capable of providing movement of sufficient accuracy such that the HPIC tray 34 is aligned appropriately with the printed testing board 40 and/or the plunging device 38. In one embodiment, the motor 50 is an X, Y, and Z axis stepper motor that may be controlled by a micro-stepper control board (not shown) in the controller 14. Information from the tray map, such as tray location identifiers may be loaded into the micro-stepper control board and converted into the control codes to position the HPIC tray 34 so that sets of IC packages 24 are aligned between the test sockets of the printed testing board 40 and the plungers of the plunging device 38. The controller 14 may also be operable to provide control codes to pick and place IC package handling device 44 so that the appropriate IC packages 24 are picked from the output SIC tray 42 and place in the appropriate output area or output segment of the test table 22.

Figure 2:
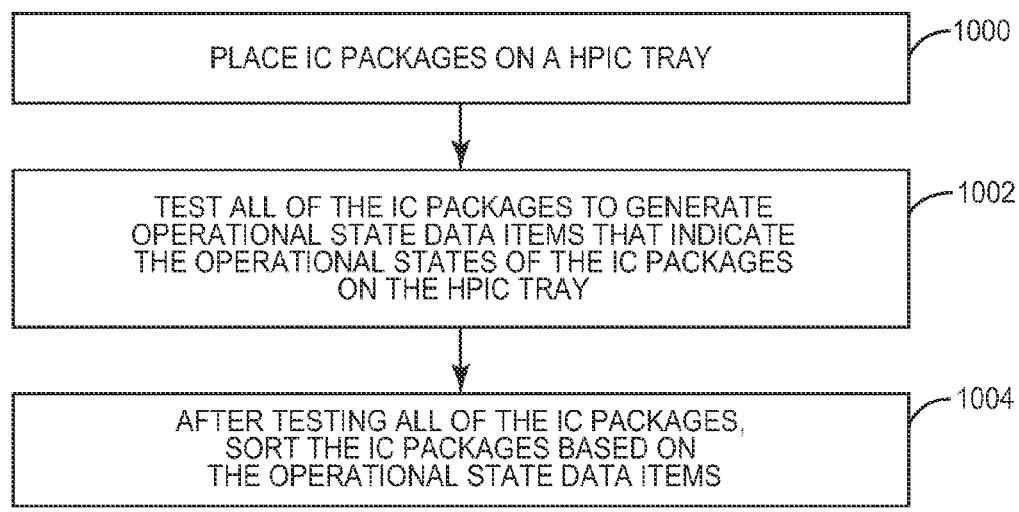
FIG. 2 illustrates exemplary procedures that may be performed by the test handler shown in FIG. 1 to organize the IC packages.

Referring now to FIGS. 1 and 2, FIG. 2 illustrates exemplary procedures that may be performed by the test handler 10 in order to organize the IC packages 24. First, the test handler 10 may place the IC packages 24 on the HPIC tray (procedure 1000). To do this, the embodiment of the test handler 10, as described above loads the input SIC tray 26 and the empty HPIC tray 34 on the flipper 32. The flipper 32 then flips the input SIC tray 26 having the IC packages 24 onto the HPIC tray 34 to place the IC packages 24 on the HPIC tray 34. As explained in further detail below, the IC packages 24 may be placed on the HPIC tray 34 in a testing orientation, which may be a dead bug configuration that allows the IC packages 24 to be tested by the printed testing board 40. Next, the test handler 10 is operable to test all of the IC packages to generate operational state data items that indicate the operational states of the IC packages 24 on the HPIC tray 34 (procedure 1002). In one embodiment, these operational state data items populate the tray map discussed above. The tray map may further include tray location identification data items that indicate a tray location on the HPIC tray 34. For example, if the HPIC tray 34 is organized in a matrix of tray locations, the tray location identification data items may each indicate an index along that matrix. The tray map may further associate the operational state data item for the IC package 24 at the tray location with the tray location identification data item that indicates the index.

After testing all of the IC packages 24, the test handler 10 may be operable to sort the IC packages based on the operational state data items (procedure 1004). The embodiment of the test handler 10 described above loads the empty output SIC tray 42 into the flipper 32 with the tested IC packages 24 on the HPIC tray 34. The output SIC tray 42 is configured so that its tray locations that correspond to the tray locations of the HPIC tray 34. For example, the output SIC tray 42 may also have a matrix of tray locations like those of the HPIC tray 34. The flipper 32 then flips the tested IC packages 24 on the output SIC tray 42. Since the output SIC tray 42 and the HPIC tray 34 have analogous tray locations, the tray map populated using the HPIC tray 34 may also be utilized with the output SIC tray 42. The test handler 10 may sort the IC packages 24 on the output SIC tray 42 based on the operational state data items from the tray map.

Figure 3A:
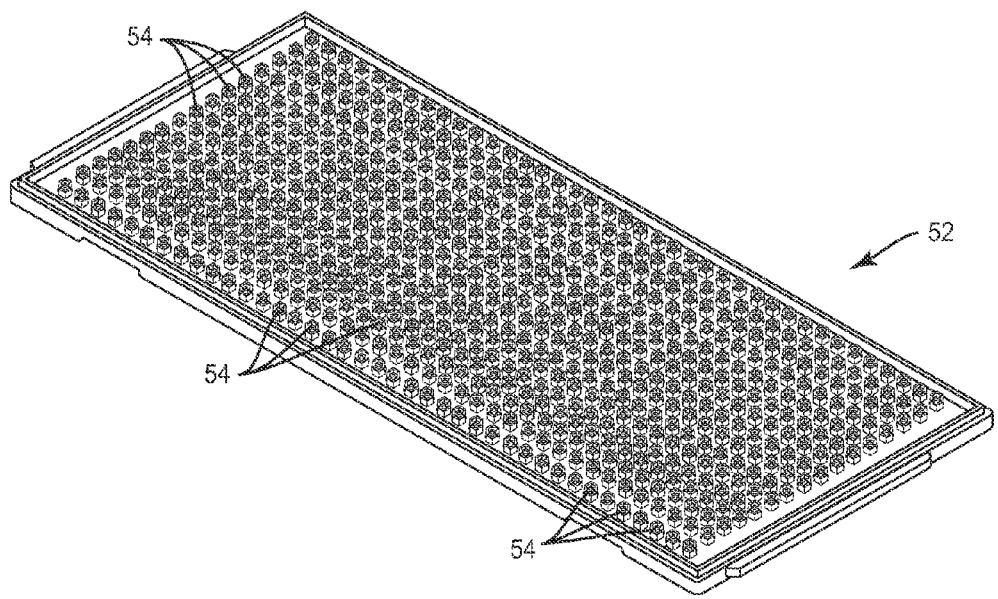
FIG. 3A illustrates one embodiment of a standard integrated package (SIC) tray on which the IC packages may be received or output by the test handler shown in FIG. 1.

Referring now to FIG. 3A, FIG. 3A illustrates one embodiment of a SIC tray 52. The SIC tray 52 may be designed to hold multiple standard IC packages. For example, the SIC tray 52 of FIG. 3A is a Joint Electronic Devices Engineering Council (JEDEC) tray that defines a matrix of pockets 54 (not all labeled for the sake of clarity). In the particular embodiment shown in FIG. 3A, each of these pockets 54 is configured to hold DIP type IC packages 24. However, different embodiments of the SIC tray 52 may be designed to hold standard IC packages of any desirable configuration. For instance, various different types of JEDEC trays may have matrixes of pockets 54 designed to hold other types of IC package such as QFN type IC packages, MQFP type IC packages, TQFP type IC packages, PQFP type IC packages, CQFP type IC packages, VQFP type IC packages, BGA type IC packages, PBGA type IC packages, CBGA type IC packages, TBGA type IC packages, PGA type IC packages, SOP type IC packages, SSOP type IC packages, TSOP-I type IC packages, TSOP-II type IC packages, TSSOP type IC packages, MFL type IC packages, and/or the like. In this embodiment, the pockets 54 define the various tray locations throughout the SIC tray 52. It should be noted that the SIC tray 52 may be an embodiment of either the input SIC tray 26 or the output SIC tray 42 of FIG. 1. Furthermore, the input SIC tray 26 and the output SIC tray 42 may be the same SIC tray as the output mechanism 46 of the test handler 10 may be configured to re-use SIC trays received by the input mechanism 20. The pockets 54 shown in FIG. 3A are empty (E) but are each configured to receive one of the IC packages 24, as described in the discussion above.

Figure 3B:
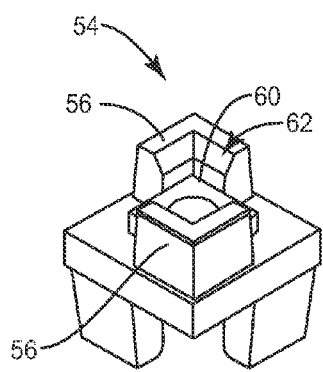
FIG. 3B illustrates a perspective view of an embodiment of a pockets on the SIC tray shown in FIG. 3A.

FIG. 3B illustrates a perspective view of an embodiment of one of the pockets 54 from the SIC tray 52. The pocket 54 has pocket walls 56 that defined the pocket 54 and are designed to hold one of the IC packages 24. The pocket 54 also has a holding end 60 and further defines a receiving opening 62 to receive the IC package.

Figure 3C:
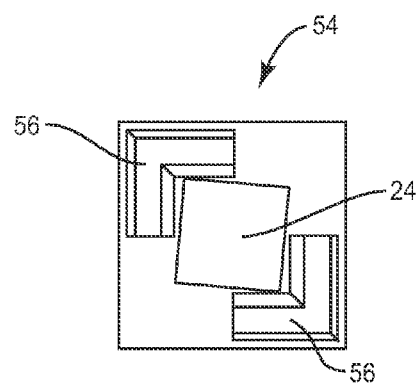
FIG. 3C illustrates a top view of the pocket shown in FIG. 3B while holding one of the IC packages.

FIG. 3C illustrates a top view of the pocket 54 from FIG. 3B having one of the IC packages 24 received in the pocket 54. Generally, a length of each of the sides of the pocket 54 is longer than a length of each of the sides of the IC package 24. This allows the IC package 24 some mobility of the IC package within the pocket 54.

Figure 3D:
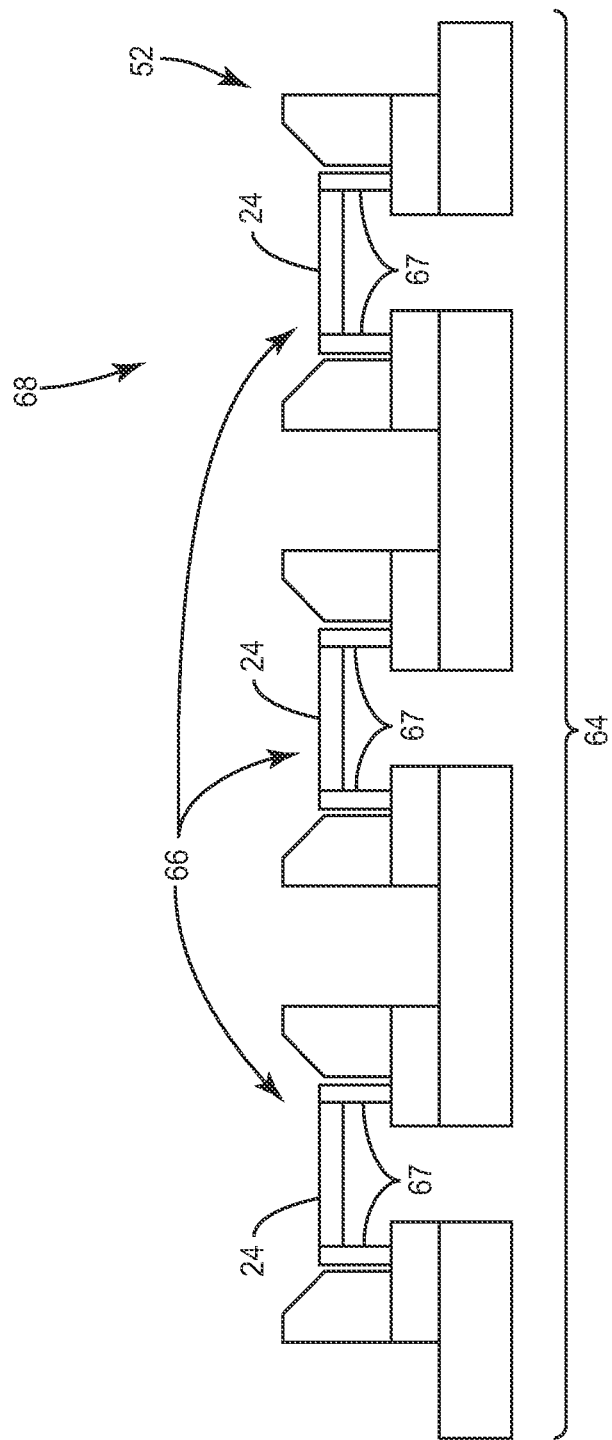
FIG. 3D illustrates a cross-sectional view of a pocket set of various pockets of the SIC tray shown in FIG. 3A holding an IC packages set of various IC packages in a live bug configuration.

FIG. 3D illustrates a cross sectional view of a set 64 of the pockets 54 on the SIC tray 52 from FIG. 3A. In this example, each of the pockets 54 from FIG. 3A has received one of the IC packages 24 from FIG. 1. A set 66 of IC packages 24 are shown in FIG. 3D received by a set 64 of pockets 54. In FIG. 3D, the set 66 of IC packages 24 are in the "live-bug configuration" (LB) since contact elements, in this case contact leads 67, are not accessible from a receiving side 68 of the SIC tray 52. The contact elements may also be contact pads, ball grids arrays, contact terminals, and/or the like depending on the type of IC package 24 held by the particular pocket 54.

Referring now to FIG. 4A, FIG. 4A illustrates one embodiment of the HPIC tray 34 from FIG. 1. Like the SIC tray 52, the HPIC tray 34 may be designed to hold multiple standard IC packages. In the particular embodiment shown in FIG. 4A, the HPIC tray 34 defines a matrix of pockets 70 (not all labeled for the sake of clarity) wherein each of these pockets 70 is configured to hold a DIP type IC packages. However, different embodiments of the HPIC tray 34 may be designed to hold standard IC packages of any desirable configuration. The pockets 70 shown in FIG. 4A are empty (E) but are each configured to hold one of the IC packages 24, as described above in the discussion of FIG. 1. The HPIC tray 34 may be made of a stable material such as metal, plastic, or rubber.

FIG. 4B illustrates a perspective view of an embodiment of one of the pockets 70 of the HPIC tray 34. The pocket 70 has pocket walls 72 that define the pocket 70 and are designed to hold one of the IC packages. The pocket 70 also has a holding end 73 of the pocket 70. The pocket walls 72 further define a receive opening 74 of the pocket 70 designed to receive the IC package while the holding end 73 defines a plunger opening 75 for receiving a plunger FIG. 4C illustrates a top view of the pocket 70 from FIG. 4B having one of the IC packages 24 received in the pocket 70. Generally, the pocket walls 72 of the pocket 70 have been configured so that the IC package 24 is consistently held within the pocket 70. In other words, the tapering of the pocket walls 72 allows for the dimensions of the pocket wall 72 to more accurately fit the dimensions of the IC package 24. In this manner, the IC package 24 can still be received through the receive opening 74 (shown in FIG. 4A) while holding the IC package 24 in a desired orientation and position within the pocket 70 that is more consistent and precise in comparison to the SIC tray 52. While not necessarily required, this added consistency makes it easier to test the IC packages 24 from the HPIC tray 34 and may lead to better results.

Figure 4D:
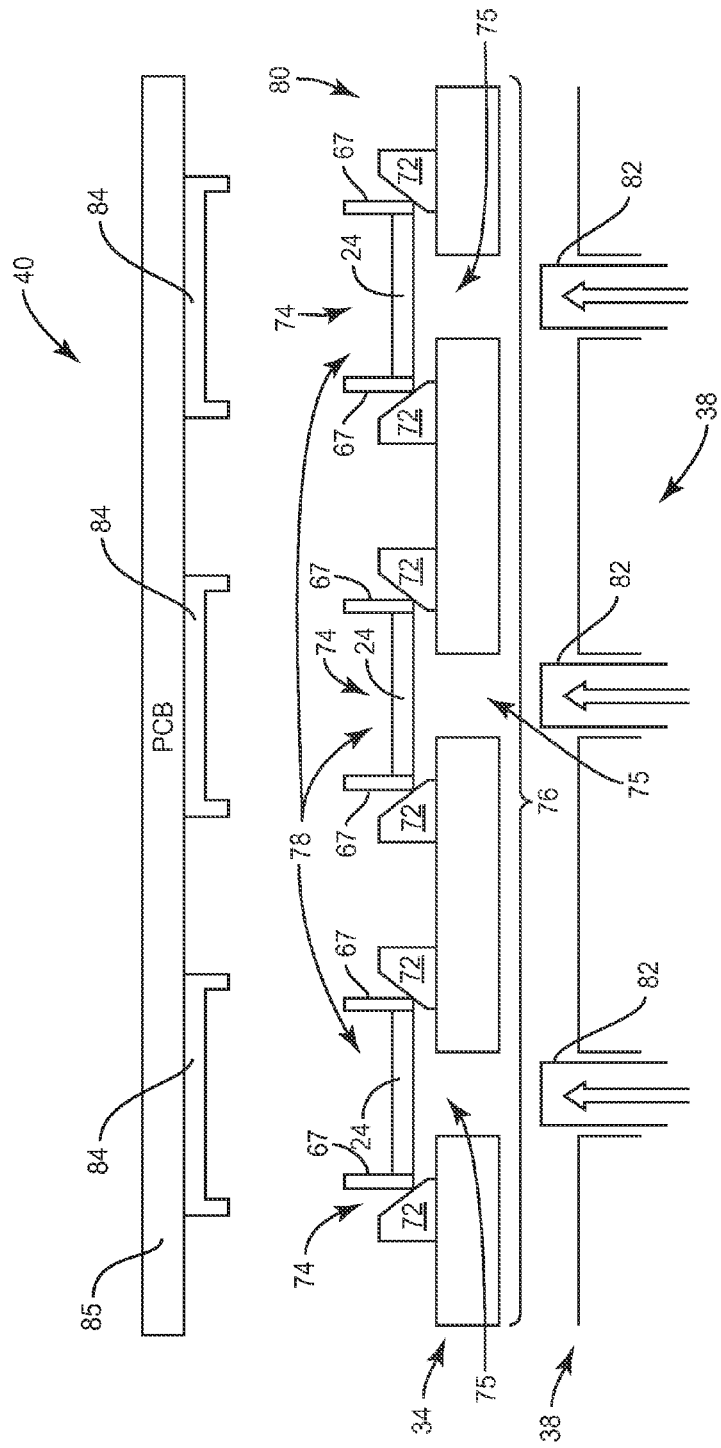
FIG. 4D illustrates a cross-sectional view of a pocket set of various pockets of the HPIC tray shown in FIG. 4A holding a IC packages set of various IC packages in a dead bug configuration.

FIG. 4D illustrates a cross sectional view of a set 76 of the pockets 70 defined by the HPIC tray 34. The pockets 70 hold a set 78 of the IC packages 24 from FIG. 1. As shown in FIG. 4D, the set 78 of IC packages 24 on the HPIC tray are in the "dead-bug configuration" (LB) since contact elements, in this case contact leads 67, are accessible from a receiving direction 80 of the HPIC tray 34. The pocket walls 72 of the pockets 70 defined by the HPIC tray have been tapered. Unlike the SIC tray 52 that allows mobility within the pocket 54, the pocket 72 of the HPIC tray 34 securely hold the IC package 24 while allowing the receive opening 74 to receive the IC package 24.

Furthermore, FIG. 4D illustrates one embodiment of the plunging device 38 along with one embodiment of the printed testing board 40. It should be noted that each of the pockets 70 from FIG. 4A have each received one of the IC packages 24 from FIG. 1. However, it is the set 76 of the pockets 70 and the set 78 of IC packages 24 that have been aligned between the plunging device 38 and the printed testing board 40. In this manner, the particular set 78 of IC packages 24 can be tested by the printed testing board 40 from a receive side 80 of the HPIC tray 34. The embodiment of the plunging device 38 shown in FIG. 4D has three (3) plungers 82 while the embodiment of the printed testing board 40 has three (3) test sockets 84. The plunging device 38 may include a vacuum mechanism (not shown) that creates a vacuum within each of the plungers 82 to vacuum hold one of the IC packages 24 in the set 78. A spring mechanism of the plunging device 38 propels each of the plungers 82 through the plunger openings 75 of the HPIC tray 34 towards the test sockets 84 on the printed testing board 40.

When the test socket 84 engages the IC package 24 from the set 78, the printed testing board 40 may perform the operations tests to generate operational state data items, as described above. It should be noted that each of the test sockets 84 may include testing elements, such as testing barrels or testing probes, to engage the contact elements of the IC packages 24. Once the testing of the set 78 of IC packages 24 is finished, the plungers 82 may place the set 78 of IC package back into the set 76 of pockets 70. The test handler 10 may iterate through various sets of the pockets 70 and the IC packages 24 on the HPIC tray 34 until all of the IC packages 24 have been tested. In this manner, a tray map may be generated of the HPIC tray 34 having operational state data items for each of the IC packages 24.

In alternative embodiments of the plunging device 38 and the printed testing board 40, the plunging device 38 may have a plunger that plunges the entire HPIC tray 34. The HPIC tray 34 would simply be moved so that a different set of the pockets 70 and the IC packages 24 would be aligned with the test sockets 84. In yet another alternative, the plunging device 38, and the printed testing board 40 may be integrated so that the test sockets 84 are plunged towards the HPIC tray 34. Again, the HPIC tray 34 would simply be moved so that a different set of the pockets 70 and the IC packages 24 would be aligned with the test sockets 84.

Figure 5:
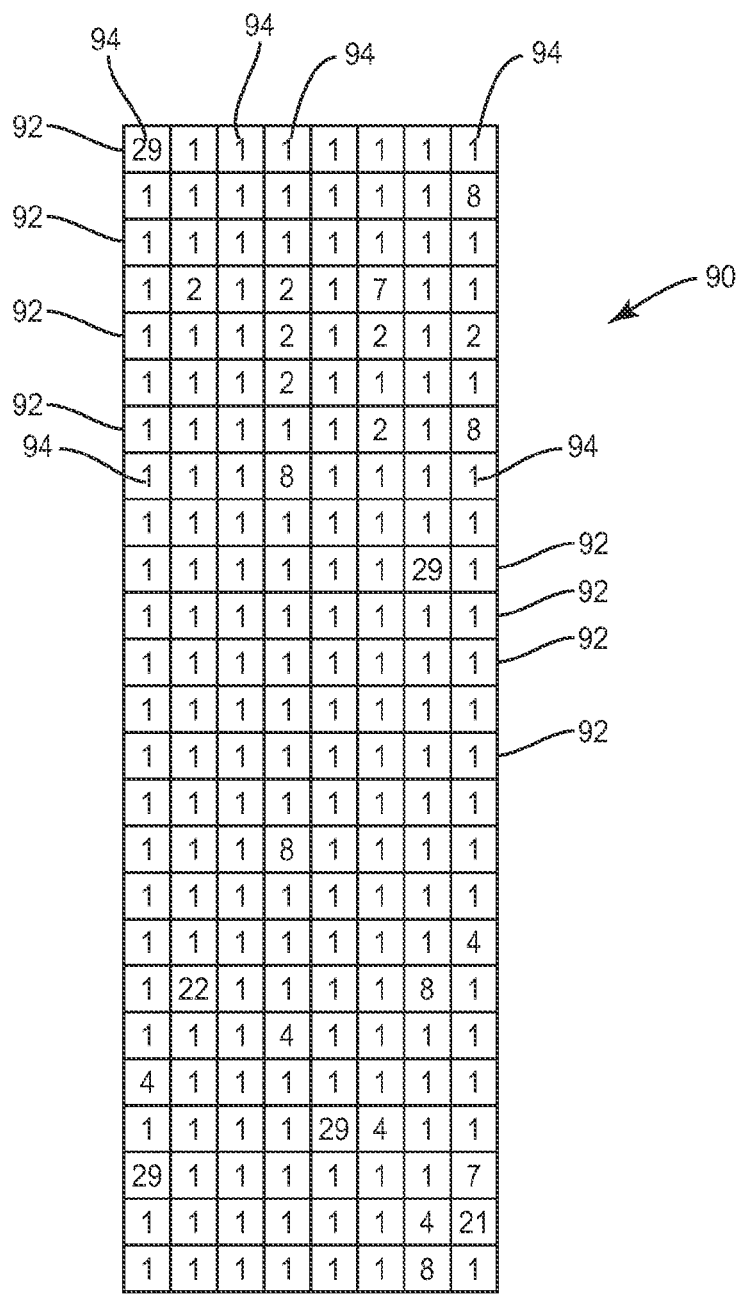
FIG. 5 is a visual representation of one embodiment of a tray map having pocket data elements that each represent a pocket of the HPIC tray and include operational state data items indicating an operational state of the IC package being held by the pocket.

FIG. 5 is a visual representation of one embodiment of a tray map 90. In this embodiment, the tray map 90 includes a matrix of pocket data elements 92 (not all labeled for the sake of clarity). Each of these pocket data elements 92 may represent one of the pockets 70 of the HPIC tray 34. The pocket data elements 92 may include pocket identification data items (not shown) that identify a particular pocket of the HPIC tray 34. Furthermore, each of the pocket data elements 92 includes an operational state data item 94 (not all labeled for the sake of clarity) that indicates an operational state of the IC packages 24 held by the particular pocket 70. The printed testing board may include a printed circuit board 85 configured to perform the operations tests. In this embodiment, the operational state data items 94 have a value of one (1) indicate that the particular IC package 24 held by the particular pocket 70 passed the operations tests. The testing 40 has thus confirmed that the IC packages are operating in a passing operational state. On the other hand, operational state data items having values of two (2), four (4), seven (7), eight (8), twenty-one (21), and twenty-nine (29) indicating that the particular IC package 24 held by the particular pocket 70 failed one or more of the operations tests and is operating in one of a plurality of failing operational states. As explained above, this tray map 90 may be utilized to sort the IC packages 24 after all of the IC packages 24 have been tested.

Figure 6:
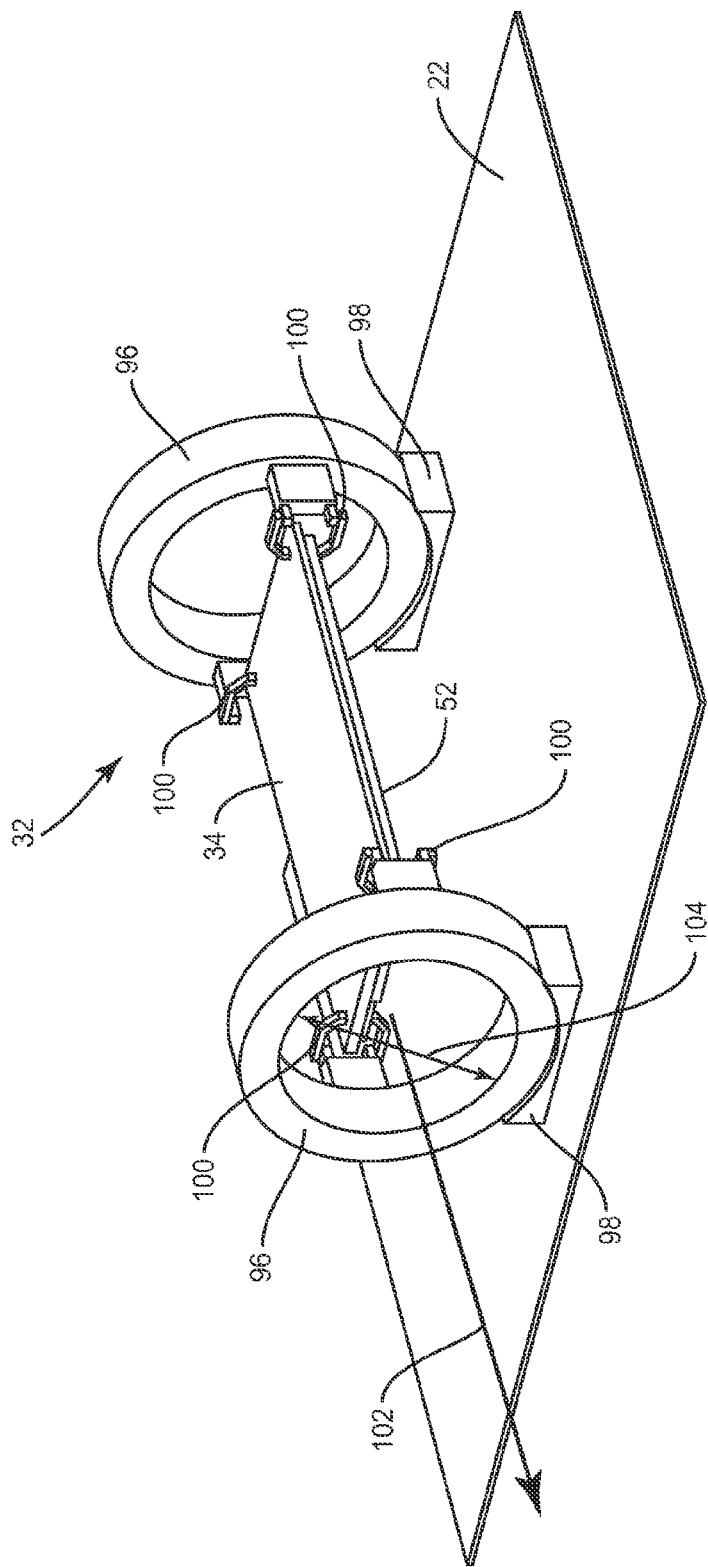
FIG. 6 illustrates one embodiment of the flipper from the test handler shown in FIG. 1 for transferring the IC packages to and from the SIC tray and the HPIC tray.

Referring now to FIG. 6, FIG. 6 illustrates one embodiment of the flipper 32 shown in FIG. 1. The embodiment of the flipper 32 shown in FIG. 6 includes a pair of bearings 96, a pair of races 98, and pneumatically actuated grippers 100 attached to the pair of bearings 96. Each of the bearings 96 is rotatably coupled to the races 98 so that the bearings 96 can be rotated about a bearing axis 102. In FIG. 6, the HPIC tray 34 and the SIC tray 52 have been loaded into the pneumatically actuated grippers 100 so that the HPIC tray 34 is over the SIC tray 52. In this example, the IC packages are assumed to be in the live bug configuration (LB) on the SIC tray 52. However, the HPIC tray 34 and the SIC tray 52 can be flipped by rotating the bearings 96 around the bearing axis 102. In this manner, the IC packages are placed on the HPIC tray 34 in the dead bug configuration (DB). Similarly, rotating the bearings 96 around the bearing axis 102 again places the IC packages on the SIC tray 52 in the live bug configuration (LB). To appropriately align the HPIC tray 34 and the SIC tray 52, the controller 14 (shown in FIG. 1) may be configured so that the tray handling device 30 (shown in FIG. 1) matches the center pitch of the HPIC tray 34 to center pitch of the SIC tray 52 when the HPIC tray 34 and the SIC tray 52 are provided in the pneumatically actuated grippers 100.

Different sizes of the bearings 96 may be selected depending on the particular application for the flipper 32. The size of the bearings 96 may affect how the HPIC tray 34 and the SIC tray 52 are loaded into and unloaded out of the flipper 32. In this embodiment, the inside diameter 104 of the bearings 96 is large enough so that the HPIC tray 34 and the SIC tray 52 trays are insertable into the bearings 96 parallel to the bearing axis 102. However, the bearings 96 may also possible be configured to have smaller diameters. In this case, the loading/unloading of the HPIC tray 34 and/or the SIC tray 52 may be between the bearings 96 and perpendicular to the bearing axis 102. Furthermore, although not specifically shown in FIG. 6, the races 98 may be provided in tracks defined by the test table 22 so that the flipper 32 can be moved to different areas or segments of the test table 22.

Figure 7:
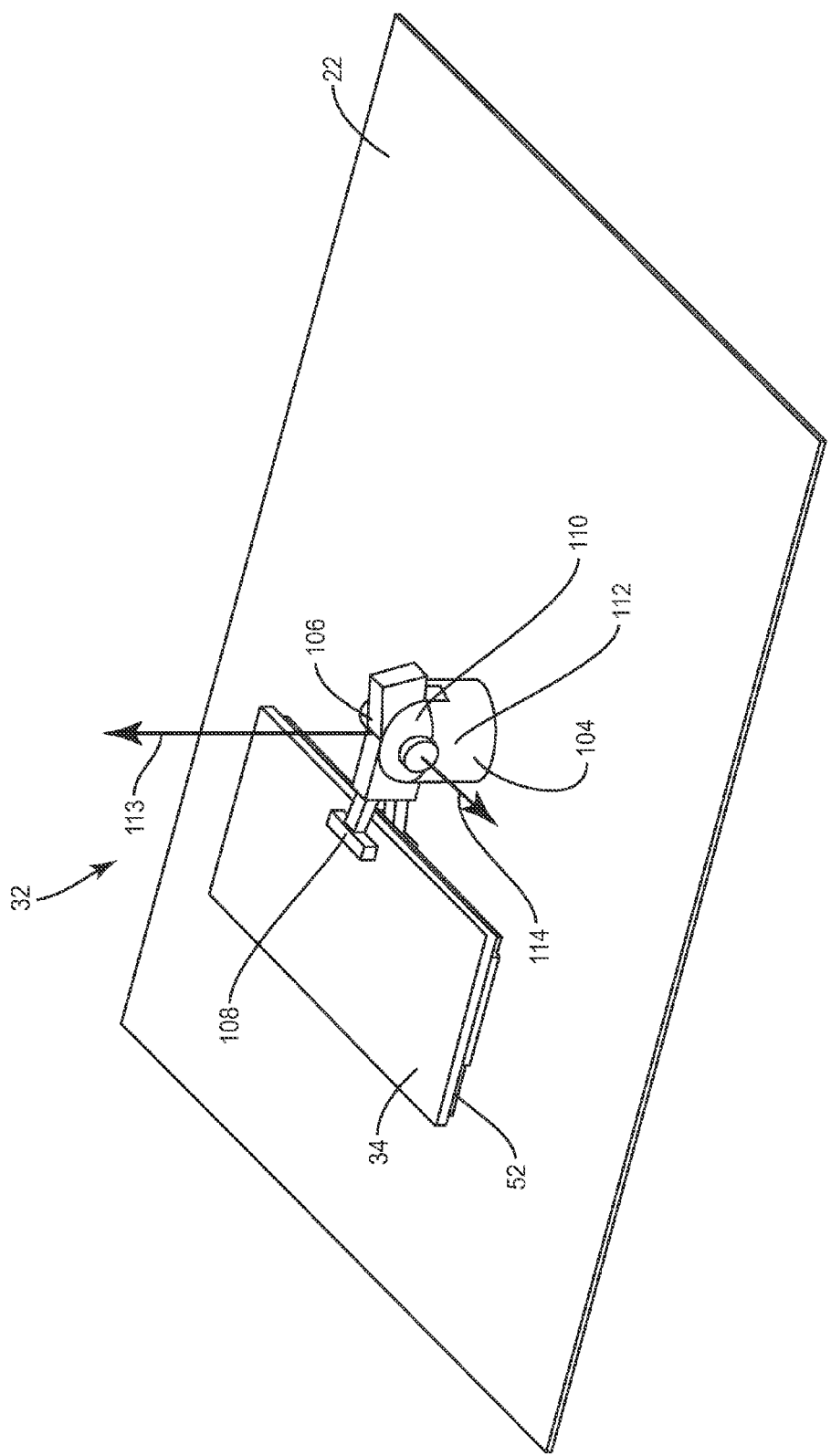
FIG. 7 illustrates another embodiment of the flipper from the test handler shown in FIG. 1 for transferring the IC packages to and from the SIC tray and the HPIC tray.

Referring now to FIG. 7, FIG. 7 illustrates another embodiment of the flipper 32 in FIG. 1. The embodiment of the flipper 32 shown in FIG. 7 includes a turret 104, a pivot arm 106 rotatably coupled to the turret 104, and grippers 108 that are movably coupled in the pivot arm 106. The turret 104 has a turret head 110 and a turret body 112. The turret head 110 is rotatably movable about a yaw axis 113. On the other hand, the pivot arm 106 is rotatably coupled to the turret head 110 so that the pivot arm 106 be rotated about a roll axis 114. In FIG. 7, the HPIC tray 34 and the SIC tray 52 have been loaded into the grippers 108 so that the HPIC tray 34 is over the SIC tray 52. Similar to the embodiment of the flipper 32 shown in FIG.

7, the IC packages can be transferred from the HPIC tray 34 to the SIC tray 52 or from the HPIC tray 34 to the SIC tray by rotating the pivot arm 106 about the roll axis 114. The controller 14 (shown in FIG. 1) may be configured so that the tray handling device 30 (shown in FIG. 1) matches the center of the HPIC tray 34 to center pitch of the SIC tray 52 when the HPIC tray 34 and the SIC tray 52 are provided in the grippers 108. Furthermore, although not specifically shown in FIG. 7, the turret 104 may be provided in tracks defined by the test table 22 so that the flipper 32 can be moved to different areas or segments of the test table 22.

Figure 8:
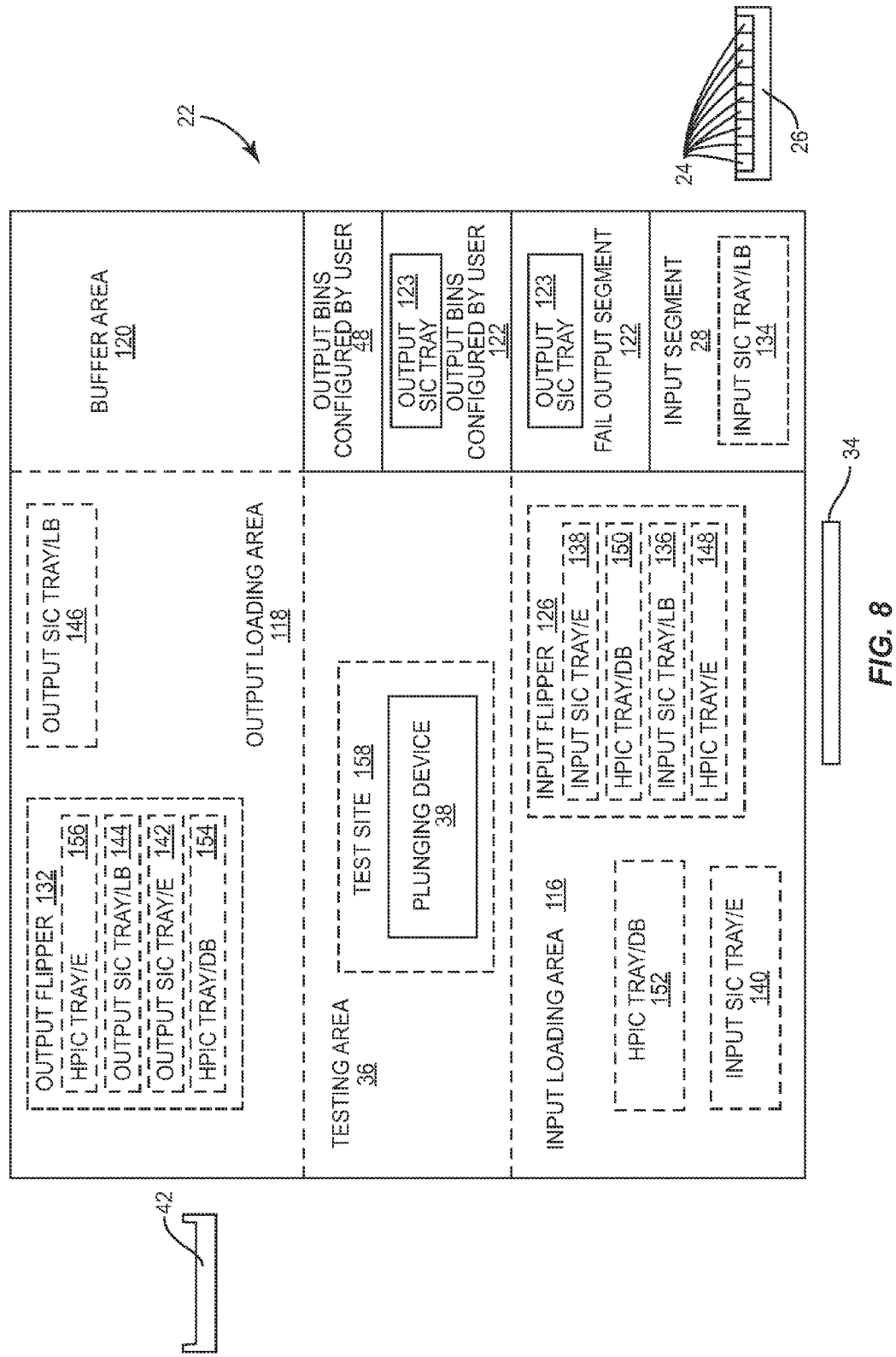
FIG. 8 illustrates one embodiment of a test table of the test handler shown in FIG. 1.

FIG. 8 illustrates one embodiment of the test table 22. In this embodiment, the test table 22 includes the input segment 28, an input loading area 116, the testing area 36, an output loading area 118, a buffer area 120, a pass output segment 48, and various failure output segments 122. Each failure output segment 122 has another output SIC tray 123. Also represented in the embodiment of the test table 22 are various locations, such as location 126 of the input flipper 32A, and location 132 of the output flipper 32B. In addition, there are various locations 134, 136, 138, 140 of the input SIC tray 26, various locations 142, 144, 146 of the output SIC tray 42, and various locations 148, 150, 152, 154, 156 of the HPIC tray 34.

Figure 9:
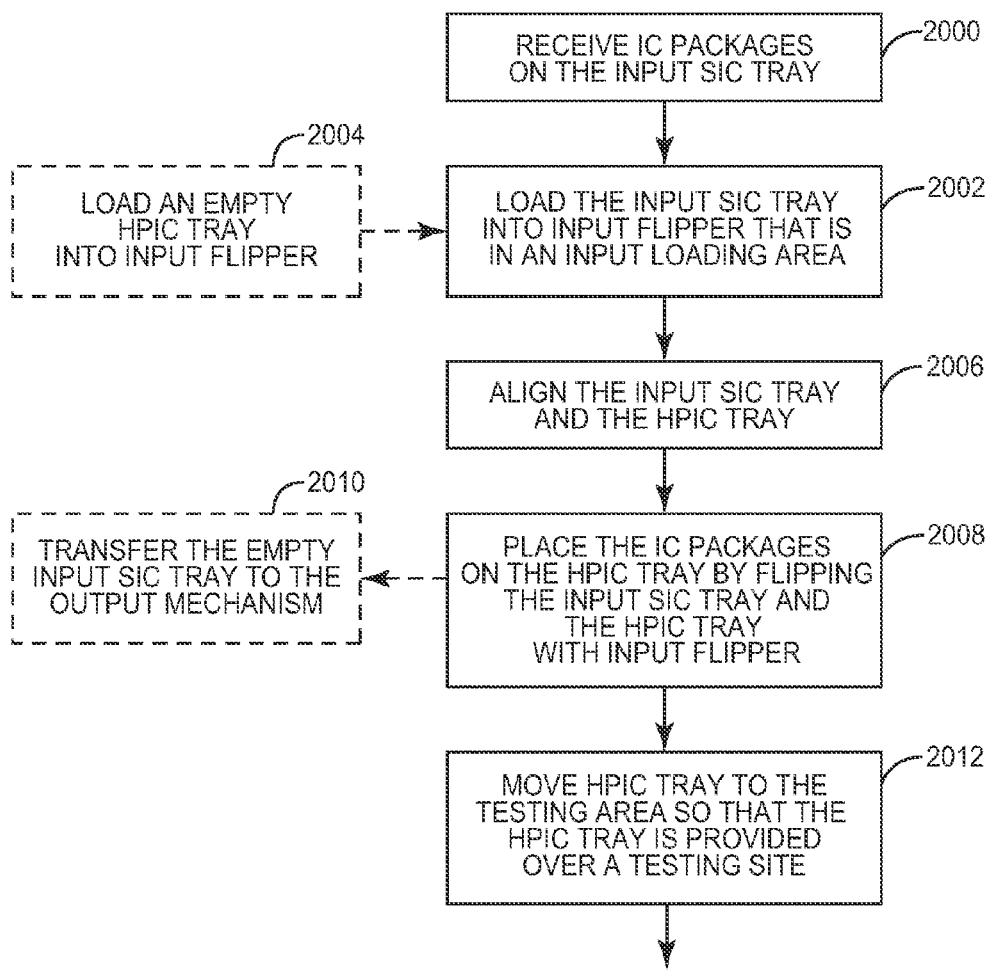
FIG. 9 illustrates exemplary procedures for placing the IC packages from the SIC tray to the HPIC tray and other related exemplary procedures.

Referring now to FIGS. 8 and 9, FIG. 9 illustrates one implementation of exemplary procedures for placing the IC packages 24 on the HPIC tray 34 along with other related exemplary procedures. Initially, the test handler 10 receives IC packages 24 on the input SIC tray 26 (procedure 2000). As explained above, the input SIC tray 26 may be provided on an input segment 28 of the input mechanism 20 and elevated to the test table 22, as shown by location 134 of the input SIC tray 26. The IC packages 24 are in the live bug configuration (LB) when the input SIC tray 26 is at location 134. Next, the test handler 10 loads the input SIC tray 26 into the input flipper 32A, which is in an input loading area 116 at location 126 (procedure 2002). When the input SIC tray 26 is loaded into the input flipper 32A, the input SIC tray 26 may be at location 136. The test handler 10 may also load an empty (E) HPIC tray 34 into the input flipper 32A at location 148 (procedure 2004).

It should be noted that while the location 148 of the HPIC tray 34 and the location 136 of the input SIC tray 26 are shown as if next to one another in the flipper 32. The location 148 of the HPIC tray 34 and the location 136 of the input SIC tray 26 when loaded into the input flipper 32A (as well as the other locations of the HPIC tray 34 and input SIC tray 26 when loaded into the output flipper 32B) are illustrated in this manner simply to help the reader keep track of the HPIC tray 34 and the input SIC tray 26. In practice, the HPIC tray 34 at location 148 may actually be over the input SIC tray 26 at location 136.

Next, the controller 14 aligns the input SIC tray 26 and the HPIC tray 34 (procedure 2006). This is done so that tray locations (i.e. pockets 54 in FIG. 3A) of the input SIC tray 26 correspond to the tray locations (i.e. pockets 70 in FIG. 4A) of the HPIC tray 34. The input flipper 32A then places the IC packages 24 on the HPIC tray 34 by flipping the input SIC tray 26 and the HPIC tray 34 with the input flipper 32A (procedure 2008). The controller 14 may initiate the actuation of the input flipper 32A once the input SIC tray 26 and the HPIC tray 34 are appropriately aligned. After flipping, the empty input SIC tray 26 are at location 138 and IC packages 24 are in the dead bug configuration (DB) on the HPIC tray 34 at location 150. Again while location 138 and 150 are shown next to one another, the input SIC tray 26 is actually be over the HPIC tray 34. Subsequently, the empty input SIC tray 26 may be removed from the input flipper 32A and placed at location 140 on the test table 22. In one implementation, the test handler 10 transfers the empty input SIC tray 26 to the output mechanism 46 (procedure 2010). In this manner, the input SIC tray 26 may be recycled. The HPIC tray 34 is also removed from the input flipper 32A and provided at location 153. The HPIC tray 34 is then moved to the testing area 36 so that the HPIC tray 34 is provided over a testing site 158 (procedure 2012). It should be noted that the location of the HPIC tray 34 is not illustrated in the testing area 36 for the sake of clarity. Furthermore, in this embodiment, the plunging device 38 is provided at the testing site 158 while the printed testing board 40 (shown in FIGS. 1 and 3D) may be provided over the testing site 158.

Figure 10:
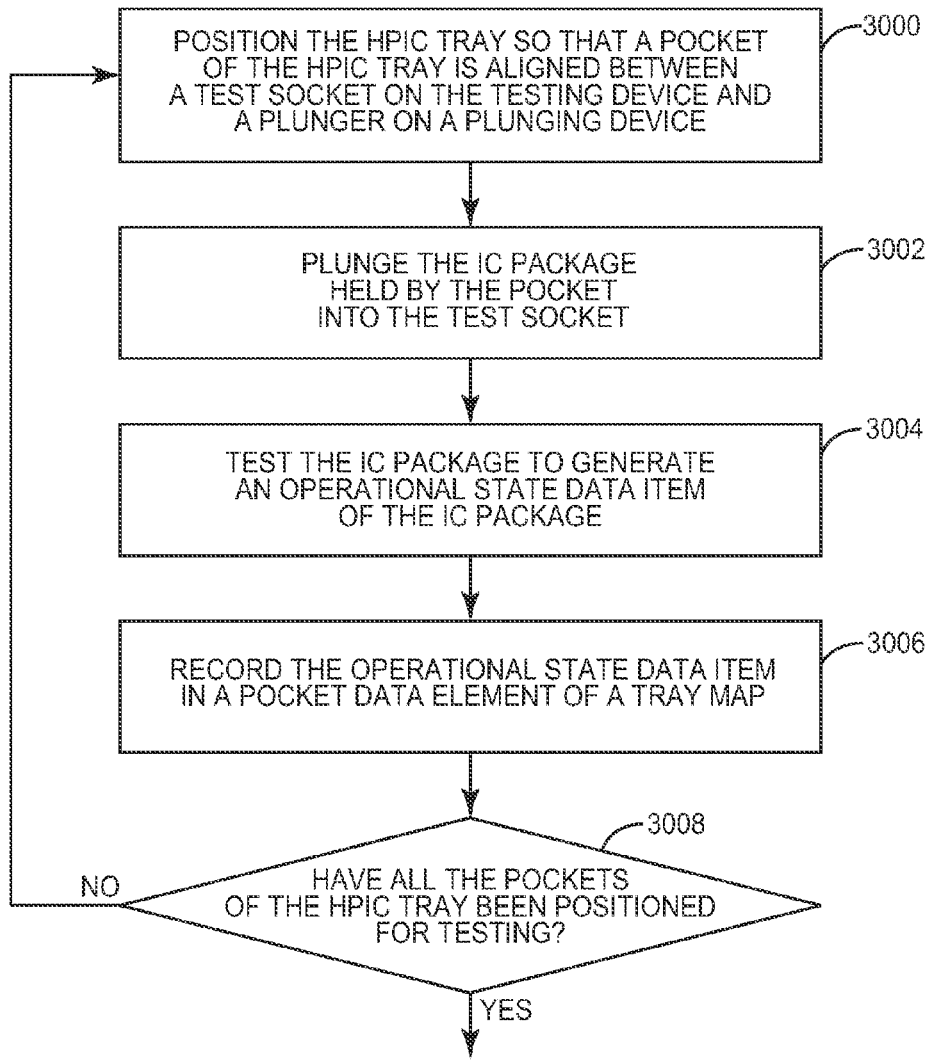
FIG. 10 illustrates exemplary procedures for testing all of the IC packages to generate operational state data items for the IC packages.

FIG. 10 illustrates one implementation of exemplary procedures for testing all of the IC packages 24 to generate operational state data items. In this embodiment, the HPIC tray 34 is assumed to define the pockets 70 (shown in FIG. 4A) and the tray locations of the IC packages 24 on the HPIC tray 34 are assumed to be provided by these pockets 70. To begin, the controller 14 positions the HPIC tray 34 so that a pocket 70 of the HPIC tray 34 is aligned between one of the test sockets 84 (shown in FIG. 4D) on the printed testing board 40 and one of the plungers 82 (shown in FIG. 4D) on the plunging device 38 (procedure 3000). If there is only one (1) plunger 82 and one (1) test socket 84, the controller 14 positions one (1) of the pockets 70 between the plunger 82 and the test socket 84. Nevertheless, as explained above, the printed testing board 40 may include multiple test sockets 84 and the plunging device 38 may include multiple plungers 82. In this case, the controller 14 positions the HPIC tray 34 so that each one of multiple pockets 70 are aligned between one of the multiple test sockets 84 and one of the multiple plungers 82. In this manner, multiple IC packages 24 can be tested on the printed testing board 40 simultaneously. Next, the test handler 10 plunges the IC package 24 held by the pocket 70 into the test socket (procedure 3002). Again, if there are multiple plungers 82 and multiple test sockets 84, multiple IC packages 24 are plunged to engage the multiple test sockets 84. Since the IC package(s) 24 are in the dead bug configuration, plunging the IC package(s) 24 held by the pocket(s) 70 allows the IC package(s) 24 to engage the test socket(s) 84 for testing. The controller 14 may initiate the actuation of the plunger(s) 82 to plunge the IC packages 24 upon determining that the pockets 70 have been appropriately aligned between the test sockets 84 and the plunger(s) 82.

The printed testing board 40 then tests the IC package 24 to generate an operational state data item of the IC package (procedure 3004). If multiple IC packages 24 have been plunged to engage the printed testing board 40, then the printed testing board 40 may generate multiple operational state data items. Each operational state data item indicates an operational state of one of the IC packages 24 as a result of the operations tests performed by the printed testing board 40. The controller 14 then records the operational state data item in a pocket data element of a tray map (procedure 3006). If there are multiple operational state data items, each of the operational state data items may be recorded in one of the pocket data elements of the corresponding pocket 70. The pocket elements may also include pocket identification data items that identify the pockets 70. For example, the pocket identification data item may be an index identifying the pocket 70, which thereby identifies the tray location of the IC package 24 on the HPIC tray 34.

Next, the controller 14 determines if all of the pockets 70 of the HPIC tray 34 have been positioned for testing (procedure 3008). If not, procedures 3000-3008 are repeated for the next set of one or more pockets 70 and the next set of one or more IC packages 24. In this manner, the controller 14 may iterate through the HPIC tray 34 until all of the IC packages on the HPIC tray 34 have been tested. Once the controller 14 determines that all of the pockets have been positioned for testing, the IC packages 24 on the HPIC tray 34 may be prepared for sorting.

Figure 11:
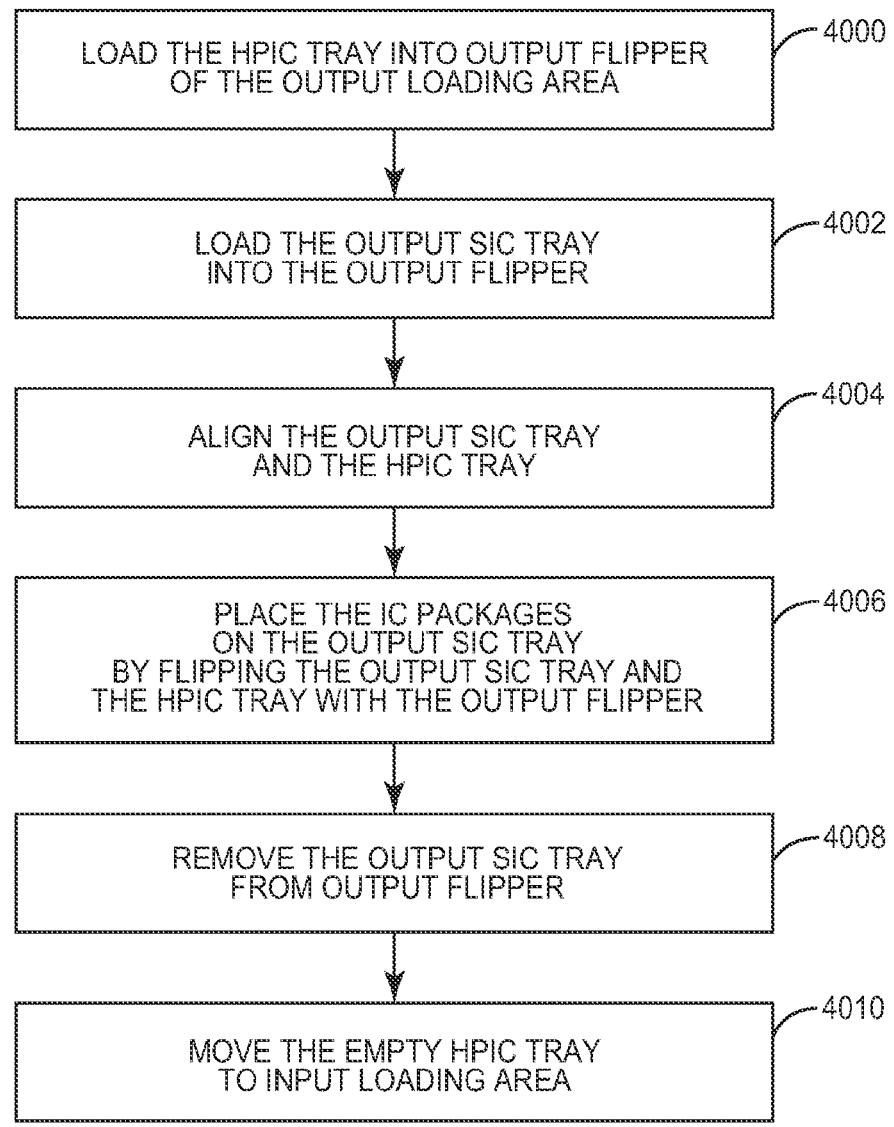
FIG. 11 illustrates exemplary procedures that place the IC packages from the HPIC tray to the SIC tray after all the IC packages have been tested and other related exemplary procedures.

Referring now to FIG. 8 and FIG. 11, FIG. 11 illustrates exemplary procedures that may be performed by the test handler 10 to prepare the IC packages 24 for sorting. After all of the IC packages 24 on the HPIC tray 34 have been tested, the test handler 10 loads the HPIC tray 34 into the output flipper 32B of the output loading area 118 (procedure 4000). The output flipper 32 is shown at location 132 on the test table 22. The HPIC tray 34 is illustrated as being loaded in the output flipper 32B at location 154 and the IC packages 24 on the HPIC tray 34 are still in the dead bug configuration. Subsequently, the test handler 10 loads the output SIC tray 42 into the output flipper 32B (procedure 4002). The output SIC tray 42 is empty and is illustrated after being loaded into the output flipper 32B at location 142. When the output SIC tray 42 is at location 142 and the HPIC tray 34 is illustrated at location 154, the output SIC tray 42 is over the HPIC tray 34. Next, the controller 14 aligns the output SIC tray 42 and the HPIC tray 34 (procedure 4004). The test handler 10 then places the IC packages 24 on the output SIC tray 42 by flipping the output SIC tray 42 and the HPIC tray 34 with the output flipper 32B (procedure 4006). In this case, the output SIC tray 42 is at the location 144 and the IC packages 24 are on the output SIC tray 42 in the live bug configuration. Furthermore, the HPIC tray 34 is at location 156 and is empty. The HPIC Tray 34 may be over the output SIC tray 42.

The test handler 10 then removes the output SIC tray 42 from the output flipper 32B (procedure 4008). The output SIC tray 42 is shown removed from the output flipper 32B at location 146 on the test table 22. Once the output SIC tray 42 has been removed from the output flipper 32B, the test handler 10 may move the empty HPIC tray 34 to the input loading area 116 (procedure 4010). In particular, the empty HPIC tray 34 may be loaded into the input flipper 32A at location 126 on the test table 22.

Figure 12A:
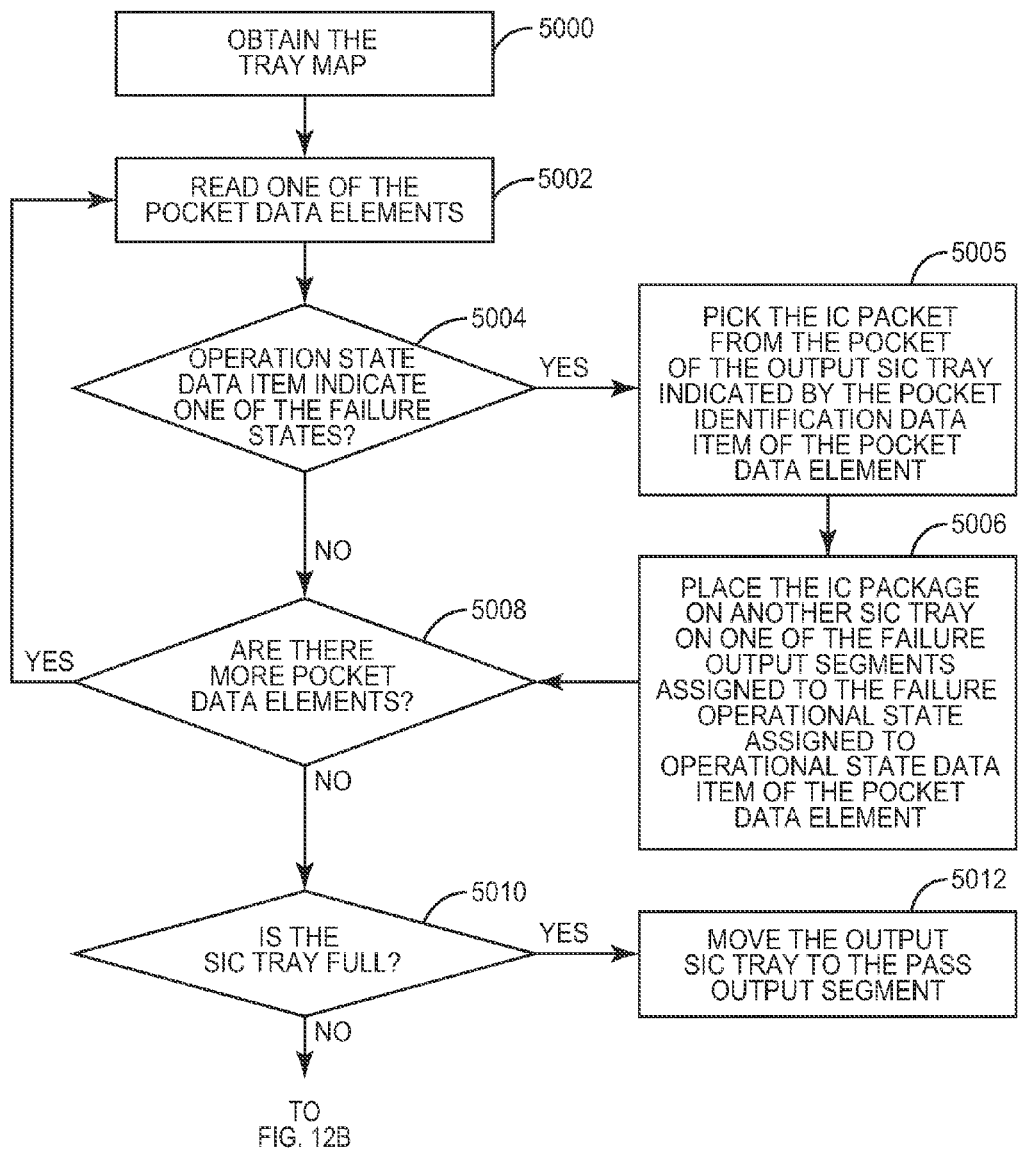
FIGS. 12A and 12B illustrate one embodiment of exemplary procedures for sorting the IC packages on the SIC tray after all of the IC packages have been tested.
Figure 12B:
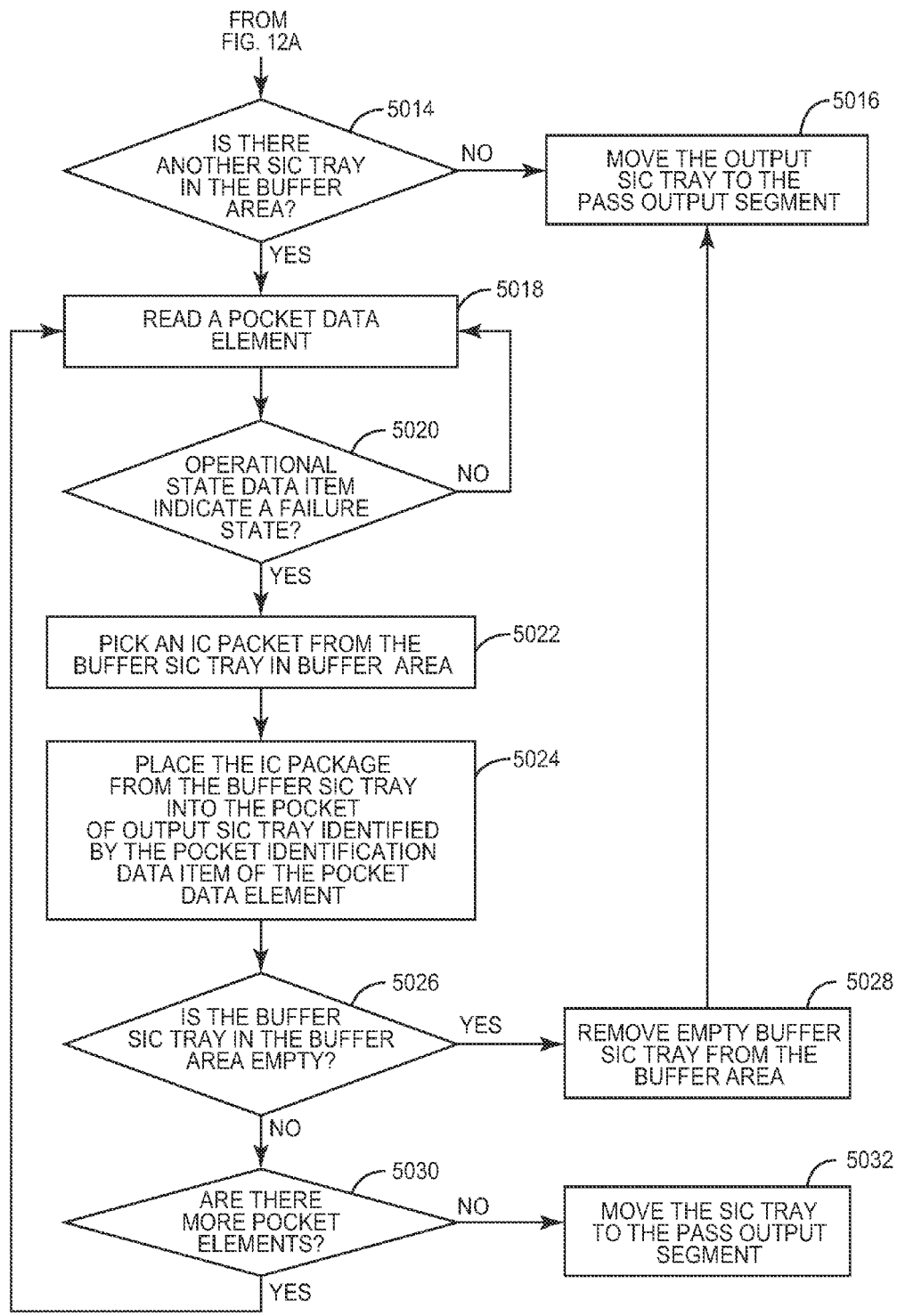

Referring now to FIGS. 8, 12A, and 12B, FIGS. 12A and 12B illustrate exemplary procedures for sorting the IC packages 24 on the output SIC tray 42. To sort the IC packages 24, the controller 14 obtains the tray map (procedure 5000). This is the tray map that was populated with the operational state data items in procedures 3000-3008 described above in FIG. 10 using the HPIC tray 34, not the output SIC tray 42. However, since the matrix of pockets 54 (shown in FIG. 3A) defined by the output SIC tray 42 correspond to the matrix of pockets 70 (shown in FIG. 3A) defined on HPIC tray 34, the tray map can also be utilized to sort the IC packages 24 on the output SIC tray 42. In one embodiment, the pocket identification data item of each pocket data element identifies an index along the matrix of the HPIC tray 34. Since the matrix of the HPIC tray 34 and the matrix of the output SIC tray 42 are corresponding pocket matrixes, the pocket identification data item on the tray map also identifies to the pocket 54 on the output SIC tray 42, which is the pocket 54 on the output SIC tray 42 that has the same index (or an index related by some defined relationship) as the pocket 70 on the HPIC tray 34. Once the tray map has been obtained, the controller 14 may read one of the pocket data elements in the tray map (procedure 5002). Upon reading the pocket data element, the controller 14 determines whether the operational state data item of the pocket data element indicates one of the failure operational states (procedure 5004). If the operational state data item indicates one the failure operational states, the pick and place IC package handling device 44 picks the IC package 24 from the pocket 54 of the output SIC tray 42 indicated by the pocket identification data item of the pocket data element (procedure 5005). The pick and place IC package handling device 44 then places the IC package 24 on another output SIC tray 123 on one of the failure output segments 122 assigned to the failure operational state indicated by the operational state data item of the pocket data element (procedure 5006). The controller 14 utilizes the pocket identification data item of the pocket element to locate the pocket 54 defined by the output SIC tray 42. After procedure 5006 or if at procedure 5004 the operational state data item does not indicate one of the failure operational states, the controller 14 then determines if there are there more pocket data elements (procedure 5008). Procedures 5000-5008 are repeated until all of the pocket elements have been read and all of the IC packages operating in one of the failure operational states have been removed from the output SIC tray 42.

Next, the controller 14 determines if the output SIC tray 42 is full (procedure 5010). This may simply be the result of not finding any pocket data elements in the tray map having operational state data items indicating one of the failure operational states and/or, similarly if all of the operational state data items indicate the pass operational state. If the output SIC tray 42 is full of IC packages 24 that are operating in the passing operational state, the test handler 10 moves the output SIC tray 42 directly to the pass output segment 48 (procedure 5012).

FIG. 12B illustrates exemplary procedures for the output SIC tray 42 if the output SIC tray is not full. In this case, the controller 14 determines if there is a buffer SIC tray in the buffer area 120 (procedure 5014). The buffer SIC tray is an SIC tray having sacrificial IC packages 24 that have already been determined to be operating in the passing operational state. If there is no buffer SIC tray in the buffer area 120, the output SIC tray 42 is moved to the buffer area 120 (procedure 5016). In other words, the output SIC tray 42 is utilized as the buffer SIC tray for another output SIC tray. It should be noted that the test handler 10 may have more than one flipper 32, such as the input flipper 32A and the output flipper 32B referenced above, and the procedures described above may be implemented by the test handler 10 with each flipper 32 in sequence.

If there is already is a buffer SIC tray in the buffer area 120, the controller 14 may read one of the pocket elements on the tray map (procedure 5018). Upon reading the pocket element, the controller 14 determines whether the operational state data item of the pocket element indicates one of the failure operational states (procedure 5020). In this manner, the controller 14 detects that the pocket 54 that is identified by the pocket identification data item is empty. If not, the controller 14 goes to procedure 5018 for the next pocket data element. On the other hand, if the operational state data item indicates one the failure operational states, the pick and place IC package handling device 44 picks an IC package from the buffer SIC tray (procedure 5022). The pick and place IC package handling device 44 then places the IC package 24 into the pocket 54 of the output SIC tray 42 identified by the pocket identification data item of the pocket data element. (procedure 5024). Once the IC package from the buffer SIC tray has been placed on the output SIC tray 42, the controller determines whether the buffer SIC tray in the buffer area 120 is empty (procedure 5024). If the buffer SIC tray is empty, the tray handling device 30 removes the empty buffer SIC tray (procedure 5028). Then, procedure 5016 is performed to move the output SIC tray 42 into the buffer area 120. If not, the controller 14 determines whether there are more pocket data element in the tray map (procedure 5030). If there are more pocket data elements, the controller 14 goes to procedure 5018 for the next pocket data element. On the other hand, if there are no more pocket data elements, then the output SIC tray 42 is full and the output SIC tray 42 is moved to the pass output segment 48 (procedure 5032). Accordingly, the amount of handling required by the test handler 10 is reduced because the IC packages 24 that are in a passing operational state do not need to be handled by the test handler 10.

Those skilled in the art will recognize improvements and modifications to the preferred embodiments of the present disclosure. All such improvements and modifications are considered within the scope of the concepts disclosed herein and the claims that follow.

What is claimed is:

1. A method of organizing a plurality of integrated circuit (IC) packages, comprising:
   placing the plurality of IC packages on a first IC package tray that defines a plurality of pockets and wherein placing the plurality of IC packages on the first IC package tray comprises placing the plurality of IC packages on the first IC package tray such that each of the plurality of IC packages is held by a different one of the plurality of pockets;
   providing a tray map of the first IC package tray wherein the tray map comprises a plurality of pocket data elements, each of the plurality of pockets representing a different one of the pocket data elements;
   testing all of the plurality of IC packages to generate a plurality of operational state data items, each of the plurality of operational state data items indicating an operational state of a different one of the plurality of IC packages on the first IC package tray wherein testing all of the plurality of IC packages to generate the plurality of operational state data items further comprises populating the tray map with the plurality of operational state data items such that each operational state data item of the plurality of operational state data items is provided in a pocket data element of the plurality of pocket elements that represents a pocket of the plurality of pockets that held an IC package from the plurality of IC packages of which the operational state data item is indicating an operational state;
   after testing all of the plurality of IC packages on the first IC package tray, sorting the plurality of IC packages based on the plurality of operational state data items.

2. The method of claim 1, wherein placing the plurality of IC packages on the first IC package tray further comprises:
   first, receiving the plurality of IC packages on a second IC package tray;
   second, loading the first IC package tray and second IC package tray into a flipper such that the first IC package tray is over the second IC package tray; and
   third, flipping the second IC package tray over the first IC package tray with the flipper to place the plurality of IC packages on the first IC package tray.

3. The method of claim 2, wherein receiving the plurality of IC packages on the second IC package tray comprises receiving the plurality of IC packages on the second IC package tray in a live bug configuration.

4. The method of claim 3, wherein flipping the second IC package tray over the first IC package tray to place the plurality of IC packages on the first IC package tray further comprises placing the plurality of IC packages in a dead bug configuration on the first IC package tray.

5. The method of claim 4, wherein the second IC package tray is a standard IC package tray and the first IC package tray is a high-precision IC package tray.

6. The method of claim 1, wherein testing all of the plurality of IC packages to generate the plurality of operational state data items, comprises:
   positioning the first IC package tray so that a first IC package set of one or more IC packages of the plurality of IC packages are aligned with one or more test sockets;
   actuating one or more plungers so that the first IC package set engages the one or more test sockets; and
   performing one or more operations tests on the first IC package set so as to generate a first operational state data item set of one or more operational state data items from the plurality of operational state data items, each of the one or more operational state data items from the first operational state data item set indicating an operational state of a different one of the one or more IC packages from the first IC package set.

7. The method of claim 6, the plurality of IC packages on the first IC package tray include one or more other IC package sets that are each of one or more other IC packages of the plurality of IC packages wherein, for each other IC package set of the other one or more IC package sets, testing all of the plurality of IC packages to generate the plurality of operational state data items, further comprises:
   again, positioning the first IC package tray so that the other IC package set is aligned with the one or more test sockets;
   again, actuating the one or more plungers so that the other IC package set engages the one or more test sockets; and
   again, performing the one or more operations tests on the other IC package set to generate an other operational state data item set of one or more other operational state data items of the plurality of operational state data items, each of the one or more other operational state data items of the other operational state data item set indicating an operational state of one of the one or more other IC packages.

8. The method of claim 6, wherein actuating the one or more plungers so that the first IC package set engages the one or more test sockets comprises plunging each of the one or more IC packages out of the first IC package tray to engage a different one of the one or more test sockets and wherein testing all of the plurality of IC packages to generate the plurality of operational state data items further comprises:
   after performing the one or more operations tests on the first IC package set, placing the first IC package set back on the first IC package tray.

9. The method of claim 6, wherein actuating the one or more plungers so that the first IC package set engages the one or more test sockets comprises plunging the first IC package tray toward the one or more test sockets.

10. The method of claim 6, wherein the one or more plungers are connected to the one or more test sockets and wherein actuating the one or more plungers so that the first IC package set engages the one or more test sockets comprises plunging the one or more test sockets toward the first IC package tray.

11. The method of claim 6, wherein the first IC package tray includes a receive side for receiving the plurality of IC packages on the first IC package tray, wherein positioning the first IC package tray so that a first IC package set of one or more IC packages of the plurality of IC packages are aligned with one or more test sockets further comprises providing the first IC package tray so that the receive side faces the one or more test sockets.

12. The method of claim 1, wherein the plurality of pockets include a multitude of pocket sets and each of the multitude of pocket sets include one or more pockets of the plurality of pockets and wherein the method further comprises:

for each pocket set of the multitude of pocket sets, testing all of the plurality of IC packages to generate the plurality of operational state data items and populating the tray map, comprises:

positioning the first IC package tray so that the pocket set is aligned with one or more test sockets;

actuating one or more plungers so that an IC package set of one or more of the plurality of IC packages held by the pocket set engages the one or more test sockets; and performing one or more operations tests on the IC package set to generate an operational state data item set of one or more operational state data items of the plurality of operational state data items, each of the one or more other operational state data items of the operational state data item set indicating an operational state of one of the one or more IC packages of the IC package set; and for each operational state data item of the operational state data item set, providing the operational state data item in a pocket data element that represents a pocket of the plurality of pockets on the first IC package tray that holds an IC package of the IC package set, wherein the operational state data item indicates the operational state of the IC package of the IC package set.

13. The method of claim 1, further comprising:

after testing all of the plurality of IC packages to generate the plurality of operational state data items, sorting the plurality of IC packages based on the plurality of operational state data items comprises sorting the plurality of IC packages using the tray map.

14. The method of claim 13, wherein the plurality of pockets of the first IC package tray are each at a different one of a first plurality of tray locations of the first IC package tray and wherein, prior to sorting the plurality of IC packages, the method further comprises:

first, loading a second IC package tray into a flipper that already has been loaded with the first IC package tray such that the second IC package tray is over the first IC package tray, wherein the second IC package tray defines a second plurality of pockets wherein each of the second plurality of pockets are each at a different one of a second plurality of tray locations of the second IC package tray and the first plurality of tray locations of the plurality of pockets defined by the first IC package tray corresponds to the second plurality of tray locations of the second plurality of pockets defined by the second IC package tray; and second, flipping the first IC package tray over the second IC package tray with the flipper to place the plurality of IC packages on the second IC package tray such that each of the plurality of IC packages is held by a one of the second plurality of pockets at a tray location of the second plurality of tray locations that corresponds to a tray location of the first plurality of tray locations of the first IC package tray.

15. The method of claim 14, wherein sorting the plurality of IC packages using the tray map is from the second IC package tray.

16. The method of claim 15, wherein the tray map has a plurality of pocket identification data items, each of first plurality of tray locations of the plurality of pockets being identified by a different one of the plurality of pocket data items whereby, since each of the second plurality of pockets at the tray location of the second plurality of tray locations correspond to the tray location of the first plurality of tray locations of the first IC package tray, the plurality of pocket identification data items also identify the second plurality of tray locations of the second plurality of pockets.

17. The method of claim 16, wherein sorting the plurality of IC packages using the tray map comprises:

reading the pocket data elements;

picking one or more failing IC packages of the plurality of IC packages from the second IC package tray using corresponding pocket identification data items of the plurality of pocket identification data items, the one or more failing IC packages of the plurality of IC packages each corresponding to operational state data items indicating that the operational states of the one or more failing IC packages is one or more failing operational states;

placing each of the one or more failing IC packages in one or more failure areas corresponding to the one or more failure states.

* * * * *